(12) United States Patent
Huang et al.

(10) Patent No.: US 6,994,568 B2
(45) Date of Patent: Feb. 7, 2006

(54) PORTABLE STORAGE DEVICE

(75) Inventors: Po-Tsang Huang, Feng-Yuan (TW); Tony Chang, Miao-Li Hsien (TW); Forli Wen, Hsinchu (TW)

(73) Assignee: C-One Technology Corporation, Hsinchu (TW)

( * ) Notice: Subject to any disclaimer, the term of this patent is extended or adjusted under 35 U.S.C. 154(b) by 33 days.

(21) Appl. No.: 10/795,179

(22) Filed: Mar. 4, 2004

(65) Prior Publication Data

US 2005/0196984 A1    Sep. 8, 2005

(51) Int. Cl.
*H01R 12/00* (2006.01)

(52) U.S. Cl. ............. 439/76.1; 439/660; 439/946; 439/571; 235/492

(58) Field of Classification Search ............. 439/76.1, 439/660, 946, 945, 571, 79; 235/492; 361/737
See application file for complete search history.

(56) References Cited

U.S. PATENT DOCUMENTS

| | | | |
|---|---|---|---|
| 5,912,806 A * | 6/1999 | Onoda et al. ............. 361/737 |
| 5,920,460 A * | 7/1999 | Oldendorf et al. ......... 361/753 |
| 6,004,144 A * | 12/1999 | Yeh et al. ............... 439/76.1 |
| 6,162,091 A * | 12/2000 | Kurotori et al. ........... 439/567 |
| 6,309,255 B1 * | 10/2001 | Yu ........................ 439/660 |
| 6,333,854 B1 * | 12/2001 | Sasaoka et al. ........... 361/737 |
| 6,626,703 B2 * | 9/2003 | Hsin ...................... 439/638 |
| 6,719,570 B2 * | 4/2004 | Tsuchioka .............. 439/76.1 |
| 6,733,329 B2 * | 5/2004 | Yang ...................... 439/518 |
| 6,778,401 B1 * | 8/2004 | Yu et al. .................. 361/752 |
| 6,854,984 B1 * | 2/2005 | Lee et al. ................. 439/79 |
| 6,877,994 B2 * | 4/2005 | Huang ................... 439/76.1 |
| 6,896,527 B1 * | 5/2005 | Peng ..................... 439/108 |

* cited by examiner

Primary Examiner—Gary Paumen

(57) ABSTRACT

A storage device includes a housing case, a terminal connector, a circuit substrate and a base. The terminal connector, the circuit substrate, and the base are inserted, in this order, inside the housing case. The terminal connector has at least a contact terminal for circuit connection on the circuit substrate for data transmission when the terminal connector is connected to the circuit substrate. The base is engaged to the circuit substrate at the end, and tightly engaged inside the housing case. The base is not only used to steadily engage the terminal connector and the circuit substrate inside the housing case, but also to elevate the circuit substrate so that the circuit is not directly in contact with the housing case to cause short-circuit.

5 Claims, 6 Drawing Sheets

PORTABLE STORAGE DEVICE

FIELD OF THE INVENTION

The present invention relates to a storage device and, more particularly, to a portable storage device housed in a single case.

BACKGROUND OF THE INVENTION

A conventional storage device, such as a flash drive, uses a terminal connector, usually a USB connector, in junction with a circuit substrate for storage purposes. The terminal connector is usually attached, or fixed, to a housing case. However, such a structure has the following disadvantages:

The USB terminal connector is exposed outside the storage device. Therefore, a metal cover is usually used to protect the USB terminal connector. Then, the metal-covered terminal connector is assembled and attached to the housing case. The final size of the device is large because of the metal cover, and thus assembly is difficult. In addition, the joint of the terminal connector and the housing case is weak and prone to damages.

Furthermore, the soldered points are the only support for joint when the USB terminal connector is soldered to the circuit substrate, which also attributes to a result that is weak and prone to damage. In addition, it is hard to repair and maintain.

In summary, the structure of the conventional storage devices needs improvement for better applications.

SUMMARY OF THE INVENTION

The present invention provides a means to fix a terminal connector, a circuit substrate, and a base, respectively, inside a housing case. The terminal connector is likely a USB connector. The terminal connector comprises at least a contact terminal for circuit connection on the circuit substrate to enable the exchange of data signals. The base is engaged at the end of the circuit substrate, and is able to engage tightly in the housing case. The base is not only used to steadily engage the terminal connector and the circuit substrate inside the housing case, but also to elevate the circuit substrate so that the circuit is not directly in contact with the housing case, and causing short-circuit.

The present invention, in comparison with conventional devices, has the following advantages:

(1) The storage device of the present invention provides better structural strength and yield rate by eliminating weak joint between the terminal connector and the housing case.

(2) The storage device of the present invention allows for easy repair. The terminal connector and the circuit substrate can be removed from the housing case by moving the base from the housing case.

(3) The storage device of the present invention avoids potential short circuits by elevating the circuit substrate, and thus avoiding its direct contact with housing case.

(4) The storage device of the present invention has enhanced strength of the joint between the terminal connector and the circuit substrate by using specific fixed connection.

These and other objects, features and advantages of the invention will be apparent to those skilled in the art, from a reading of the following brief description of the drawings, the detailed description of the preferred embodiment, and the appended claims.

DETAILED DESCRIPTION OF THE PREFERRED EMBODIMENTS

Figure 1:
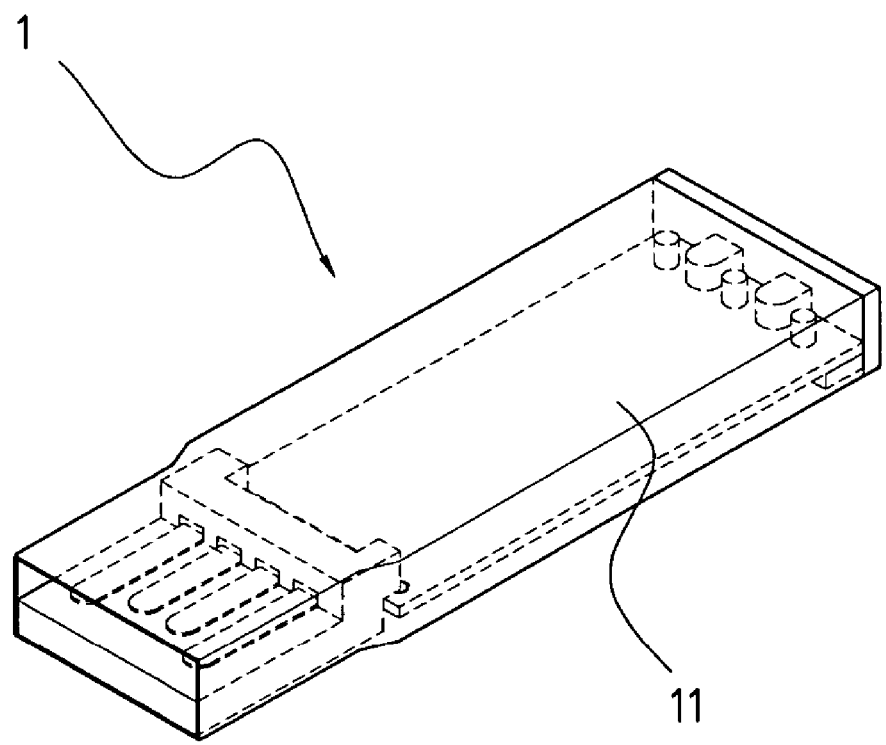
FIG. 1 shows a perspective view of a portable storage device constructed in accordance with a preferred embodiment of the present invention.
Figure 2:
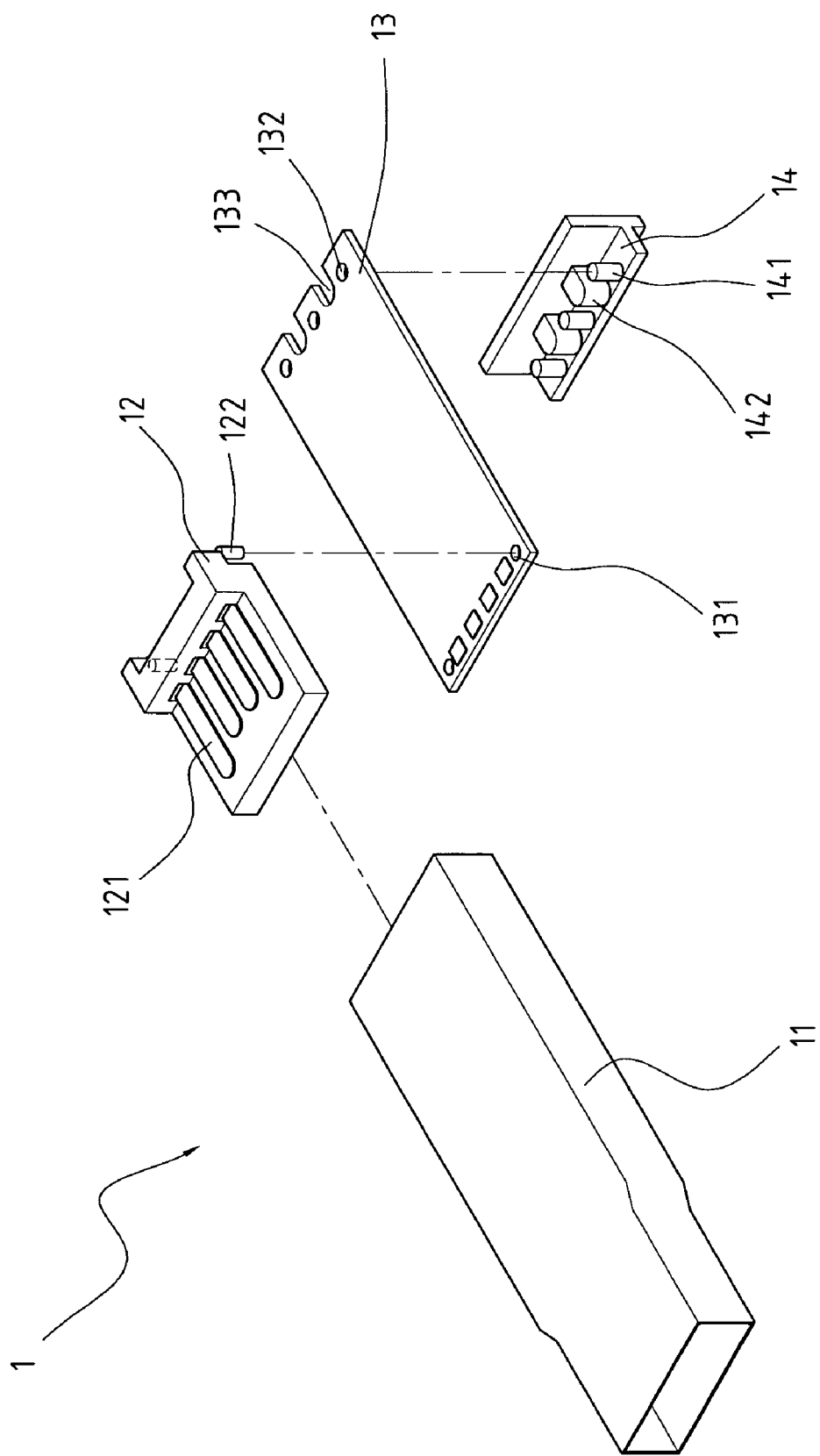
FIG. 2 shows an exploded view of the portable storage device of the present invention.

With reference to the drawings and in particular to FIGS. 1 and 2, a portable storage device constructed in accordance with the present invention, generally designated with reference numeral 1, comprises a housing case 11, a terminal connector 12, a circuit substrate 13, and a base 14. Terminal connector 12, circuit substrate 13 and base 14, in this order, are inserted and fixed inside housing case 11. Housing case 11 is integrally formed by stamping, bending or other known techniques. Terminal connector 12, usually a USB connector, comprises at least a contact terminal 121. When terminal connector 12 connects circuit substrate 13, contact terminal 121 is on circuit substrate 13 for transmission of information. The circuit on circuit substrate 13 comprises storage components for storing information. As the circuit is known in the art and constitutes no novel part of the present invention, it is not shown in detailed in this disclosure. Terminal connector 12 also comprises at least a positioned pole 122 at the bottom edge, and circuit substrate 13 comprises an equal number of positioned holes 131. Therefore, in addition to a fixed joint by contact terminal 121 and circuit substrate 13, terminal connector 12 and circuit substrate 13 can also be connected by using positioned poles 121 and positioned holes 131. Similarly, the end of circuit substrate 13 is engaged to base 14. The joint between base 14 and circuit substrate 13 is fixed in a specific engaging positioned block 142 and positioned poles 141 on base 14, with positioned slot 133 and positioned holes 132 on circuit substrate 13. As can be seen in FIG. 2, one positioned block is formed between two adjacent positioned poles 141 to strengthen and balance the engagement between the base 14 and the circuit substrate 13. Furthermore, base 14 can be tightly engaged inside housing case 11 by means of the bottom recess formed underneath the positioned blocks 142 and positioned poles 141. In case repair is needed, the components inside housing ease 11 can be easily removed from the case by removing base 14 from housing case 11. This greatly reduces the cost and time repairs.

Figure 3:
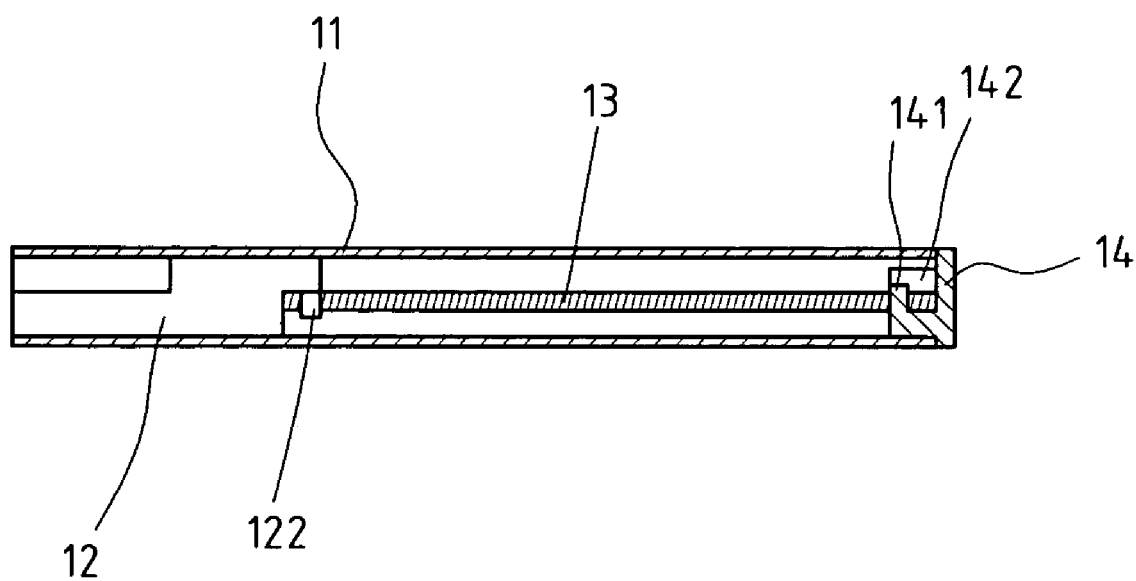
FIG. 3 shows a cross-sectional view of the portable storage device of present invention.

Also referring to FIG. 3, the portable storage device 1 comprises a terminal connector 12, a circuit substrate 13, and a base 14 inserted, in this order, inside a housing case 11. In addition to the fixed joint by soldering contact terminal 121 and circuit substrate 13, terminal connector 12, circuit substrate 13 and base 14 are also joined by engaging positioned poles 122 on terminal connector 12 with positioned holes 131 on circuit substrate 13, and by engaging positioned poles 141 and positioned blocks 142 on base 14 with positioned holes 132 and positioned slot 133 on circuit substrate 13. With base 14, the device 1 of the present invention can tightly fix terminal connector 12 and circuit substrate 13 inside housing case 11, as well as elevate the end of circuit substrate 13 to prevent direct contact with housing case 11 to cause short-circuit. Furthermore, because terminal connector 12 is housed inside housing case 11, which is a member, the overall size of the device is smaller, while the structural strength is stronger.

Figure 4:
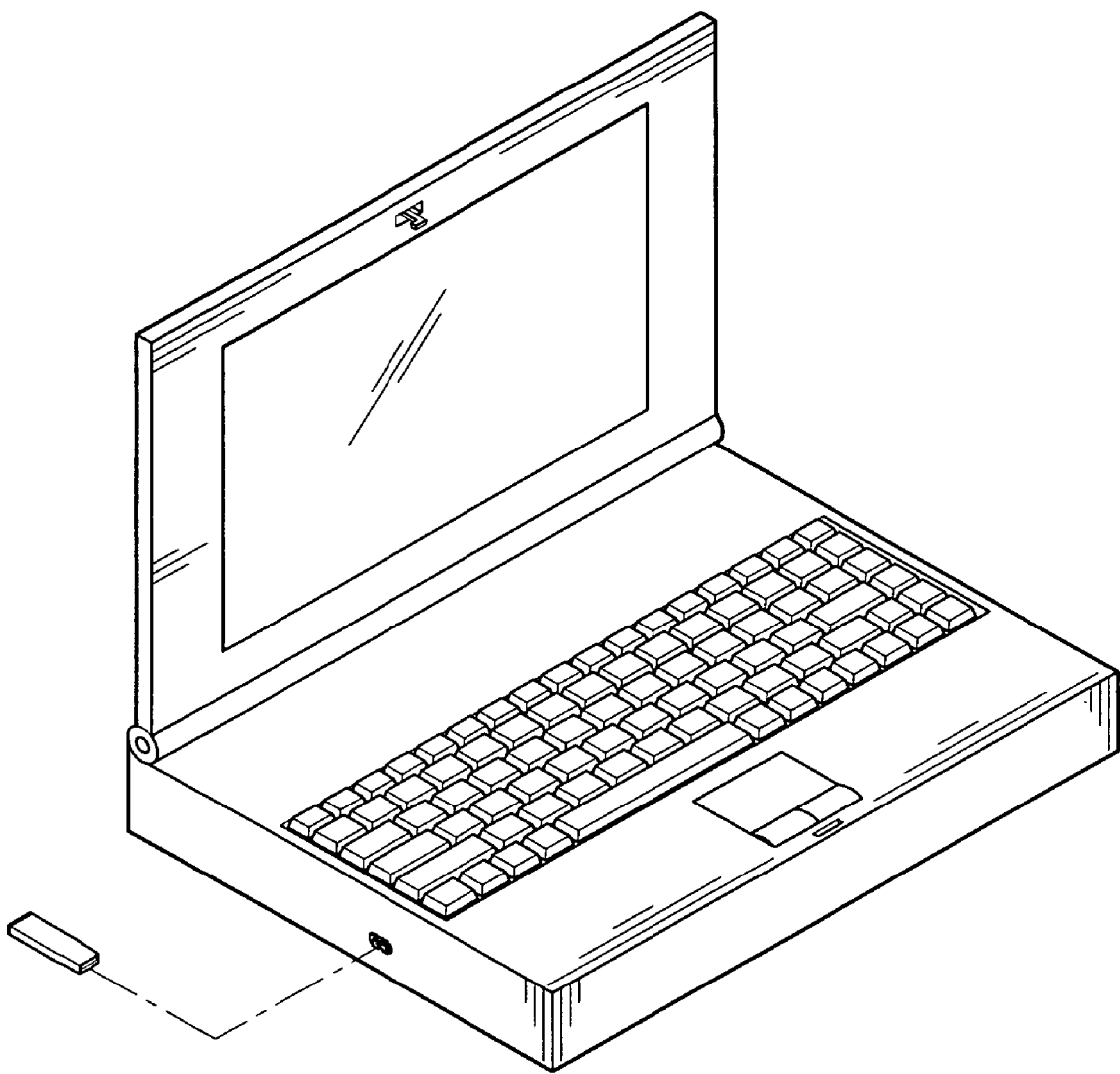
FIG. 4 shows an application of the present invention wherein the portable storage device is to be coupled to a notebook computer.
Figure 4A:
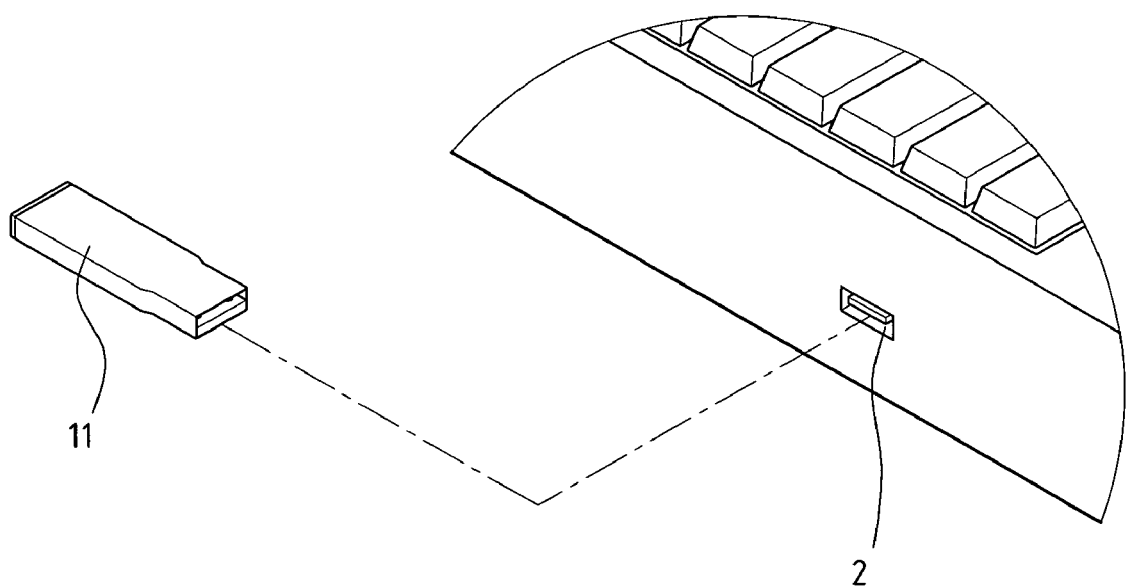
FIG. 4A shows an enlarged view of a portion of FIG. 4 to detailedly illustrate the coupling between the portable storage device and the notebook computer.

Also referring to FIGS. 4 and 4A, the portable storage device 1 can be connected to a USB connector 2 on an electronic device, such as a notebook computer for data transmission.

Figure 5:
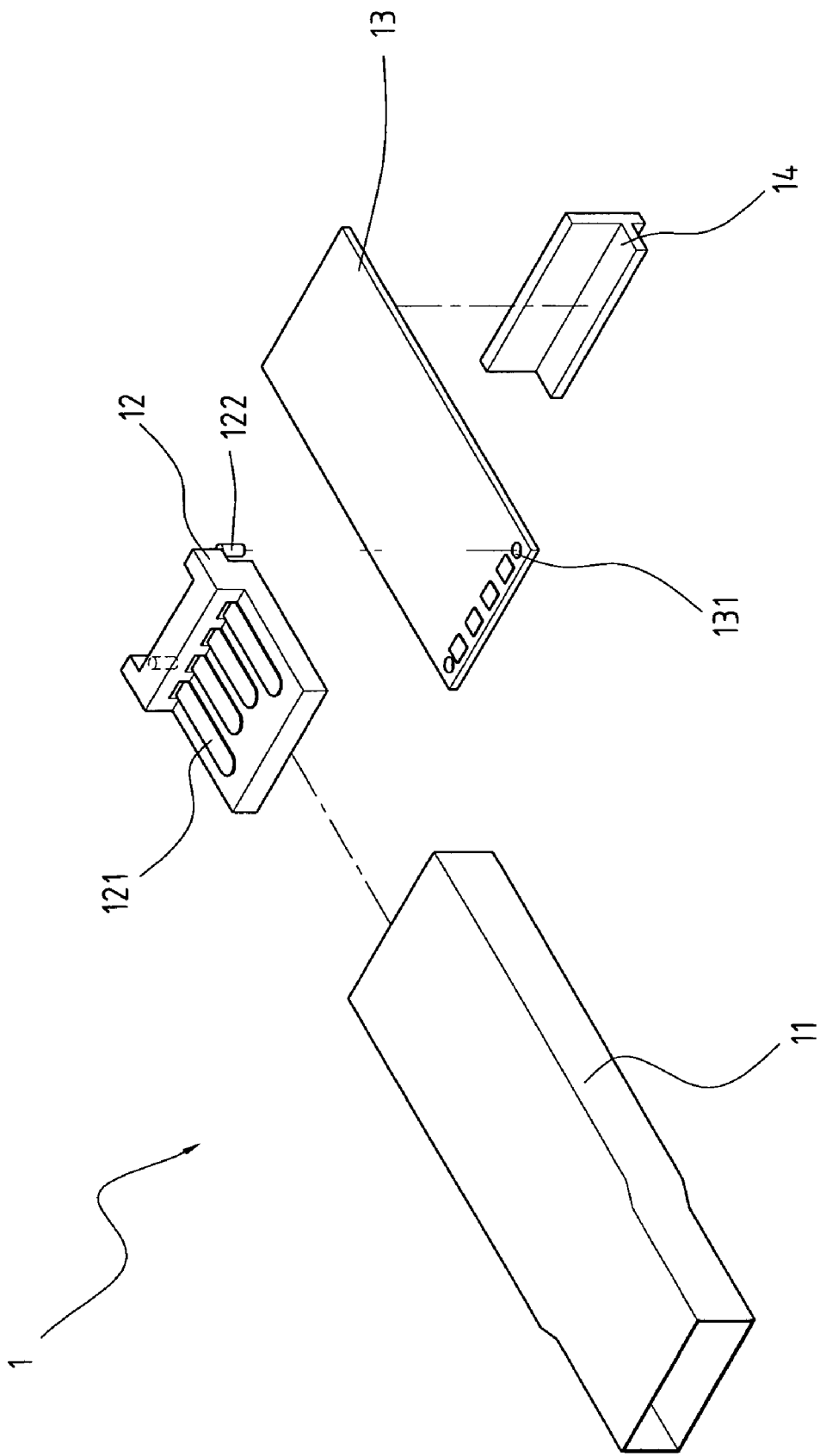
FIG. 5 shows an exploded view of a portable storage device in accordance with another embodiment of the present invention.

FIG. 5 shows another embodiment of the portable storage device in accordance with the present invention. In addition to the step-shaped on both sides shown in the previous embodiment with reference to FIGS. 1–3, the outer edge of housing case 11 can also be shaped as flat and straight. Positioned blocks 142 and positioned poles 141 on base 14 (shown in the previous embodiment illustrated in FIG. 2) can be eliminated. By pushing base 14 tightly against circuit substrate 13, it is also possible to engage circuit substrate tightly inside housing case 11.

While the invention has been described in connection with what is presently considered to be the most practical and preferred embodiment, it is to be understood that the invention is not to be limited to the disclosed embodiment, but, on the contrary, it should be clear to those skilled in the art that the description of the embodiment is intended to cover various modifications and equivalent arrangement included within the spirit and scope of the appended claims.

What is claimed is:

1. A storage device, comprising:
    a housing case having a front end and a rear end;
    a terminal connector having at least a contact terminal;
    a base member having a plurality of positioned poles and a plurality of positioned blocks, each positioned block being disposed between two adjacent positioned poles; and
    a circuit substrate having a first end coupled to said terminal connector and a second end coupled to said base member, said second end having a plurality of positioned slots for engaging with said plurality of positioned blocks and a plurality of positioned holes for engaging with said plurality of positioned poles;
    wherein said circuit substrate is enclosed in said housing case with said base member tightly covering said rear end of said housing case.

2. The storage device as claimed in claim 1, wherein the housing case is integrally formed of metal.

3. The storage device as claimed in claim 1, wherein the housing case is made of a one-piece bent metal.

4. The storage device as claimed in claim 1, wherein the terminal connector comprises at least a positioned pole at a bottom edge, and the positioned pole of the terminal connector is engageable with a positioned hole formed on the first end of the circuit substrate.

5. The storage device as claimed in claim 1, wherein the base member further comprises a bottom recess underneath said plurality of positioned poles and positioned blocks of said base member for engaging with said rear end of said housing case.

* * * * *